(12) United States Patent
Ohara

(10) Patent No.: US 8,524,313 B2
(45) Date of Patent: Sep. 3, 2013

(54) METHOD FOR MANUFACTURING A DEVICE

(75) Inventor: Hiroki Ohara, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/405,478

(22) Filed: Feb. 27, 2012

(65) Prior Publication Data

US 2012/0156365 A1 Jun. 21, 2012

Related U.S. Application Data

(63) Continuation of application No. 10/911,519, filed on Aug. 5, 2004, now Pat. No. 8,123,862.

(30) Foreign Application Priority Data

Aug. 15, 2003 (JP) .................................. 2003-293837

(51) Int. Cl.
*C23C 16/448* (2006.01)

(52) U.S. Cl.
USPC .......................................... 427/69; 427/248.1

(58) Field of Classification Search
USPC ..................................... 427/58, 64, 69, 248.1
See application file for complete search history.

(56) References Cited

U.S. PATENT DOCUMENTS

| | | | |
|---|---|---|---|
| 2,435,997 A | | 2/1948 | Bennett |
| 3,931,490 A | | 1/1976 | Grothe et al. |
| 4,023,523 A | | 5/1977 | Ing |
| 4,187,801 A | | 2/1980 | Monk |
| 4,625,096 A | * | 11/1986 | Fletcher ........................ 392/441 |
| 4,627,989 A | | 12/1986 | Feuerstein et al. |
| 4,856,457 A | | 8/1989 | Knauer |
| 4,897,290 A | | 1/1990 | Terasaka et al. |
| 5,031,229 A | | 7/1991 | Chow |
| 5,258,325 A | | 11/1993 | Spitzer et al. |
| 5,262,194 A | * | 11/1993 | Bischer et al. ..................... 427/9 |
| 5,429,884 A | | 7/1995 | Namiki et al. |
| 5,817,366 A | | 10/1998 | Arai et al. |
| 6,132,280 A | | 10/2000 | Tanabe et al. |
| 6,177,132 B1 | * | 1/2001 | Kunieda et al. ................. 427/162 |
| 6,179,923 B1 | | 1/2001 | Yamamoto et al. |
| 6,237,529 B1 | | 5/2001 | Spahn |
| 6,244,212 B1 | | 6/2001 | Takacs et al. |
| 6,296,894 B1 | * | 10/2001 | Tanabe et al. ....................... 427/8 |
| 6,326,726 B1 | | 12/2001 | Mizutani et al. |
| 6,403,392 B1 | | 6/2002 | Burrows et al. |
| 6,482,752 B1 | | 11/2002 | Yamazaki et al. |
| 6,562,126 B2 | | 5/2003 | Price |
| 2001/0006827 A1 | * | 7/2001 | Yamazaki et al. ............... 438/30 |
| 2001/0009154 A1 | | 7/2001 | Nguyen et al. |
| 2002/0011205 A1 | | 1/2002 | Yamazaki et al. |
| 2002/0017245 A1 | | 2/2002 | Tsubaki et al. |
| 2002/0132047 A1 | | 9/2002 | Yamazaki et al. |
| 2002/0197760 A1 | | 12/2002 | Yamazaki et al. |
| 2003/0044517 A1 | * | 3/2003 | Nishikawa et al. .............. 427/66 |
| 2003/0072876 A1 | * | 4/2003 | Chung ........................ 427/248.1 |
| 2003/0170380 A1 | * | 9/2003 | Nakano et al. ................... 427/66 |
| 2004/0031442 A1 | * | 2/2004 | Yamazaki et al. ............. 118/727 |
| 2004/0035360 A1 | * | 2/2004 | Yamazaki et al. ............. 118/715 |
| 2004/0035366 A1 | | 2/2004 | Keum et al. |
| 2004/0244580 A1 | * | 12/2004 | Coney et al. ..................... 92/174 |

FOREIGN PATENT DOCUMENTS

| | | |
|---|---|---|
| JP | 64-025973 | 1/1989 |
| JP | 01-042392 | 2/1989 |
| JP | 02-038923 | 10/1990 |
| JP | 09-256142 | 9/1997 |
| JP | 10-041069 | 2/1998 |
| JP | 10-195639 | 7/1998 |
| JP | 2000-223269 | 8/2000 |
| JP | 2001-093667 | 4/2001 |
| JP | 2003-045649 | 2/2003 |
| JP | 2003-045650 | 2/2003 |
| JP | 2003-115379 | 4/2003 |
| JP | 2004-035964 | 2/2004 |
| JP | 2004-099942 | 2/2004 |
| JP | 2004-099942 | 4/2004 |
| WO | WO 01/31081 | 5/2001 |

OTHER PUBLICATIONS

Shtein, Max, et al., "Material transport regimes and mechanisms for growth of molecular organic thin films using low-pressure organic vapor phase deposition". Journal of Applied Physics, vol. 89, No. 2, Jan. 15, 2001, pp. 1470-1476.*

Lin, Chang-Ting, et al., "Influences of evaporation temperature on electronic structures and electrical properties of molybdenum oxide in organic light emitting devices". Journal of Applied Physics 107, 053703 (2010), pp. 1-3.*

Webster's II New Riverside University Dictionary, Houghton Mifflin Company, 1984, pp. 686, 823 and 917.

Webster's Ninth New Collegiate Dictionary, Merriam Webster, 1986, pp. 775 and 1186.

* cited by examiner

*Primary Examiner* — Bret Chen

(74) *Attorney, Agent, or Firm* — Nixon Peabody LLP; Jeffrey L. Costellia

(57) ABSTRACT

A method for manufacturing a device, including evaporating a material at a first position, and moving a container that includes the material to a second position, so that an opening of the container is heated at a second temperature higher than a first temperature, the first temperature being a temperature of the opening at the first position, is provided.

28 Claims, 6 Drawing Sheets moving route of evaporation holder transfer route of substrate

FIG. 6A
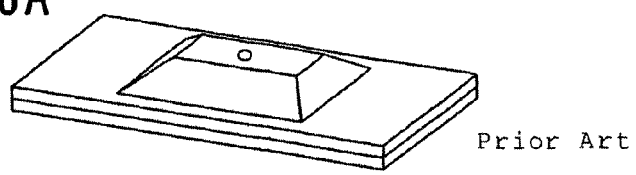
Prior Art
FIG. 6B  FIG. 6C
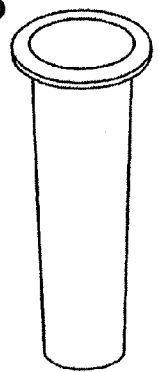
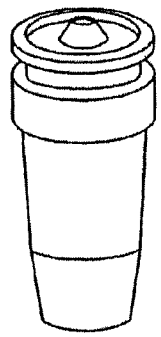
Prior Art
Prior Art

METHOD FOR MANUFACTURING A DEVICE

CROSS-REFERENCE TO RELATED APPLICATIONS

This application is a continuation of U.S. patent application Ser. No. 10/911,519, filed Aug. 5, 2004, now U.S. Pat. No. 8,123,862.

BACKGROUND OF THE INVENTION

1. Field of the Invention

The present invention relates to a manufacturing apparatus equipped with a deposition apparatus in an evaporation step of carrying out deposition by vaporizing a material (hereinafter, referred to as an evaporation material).

2. Description of the Related Art

In recent years, research on a light-emitting device having an electroluminescence element (hereinafter, referred to as an EL element) as a self-luminous type light-emitting element is advanced. Especially, an EL element having an organic compound is also referred to as organic EL or an organic light emitting diode (OLED). The light-emitting devices using these elements have properties such as high response speed appropriate for an animation display, driving with low voltage or low power consumption; therefore, the devices are widely drawn attention as a next-generation display, especially as a flat panel display as well as a new-generation cellular phone or a personal digital assistant (PDA).

The structure of an El element is a laminated structure in which a layer containing an organic compound (hereinafter, referred to as an EL layer) is sandwiched between an anode and a cathode. An exciton is generated by recombining an electron hole and an electron in the EL layer by applying an electric field to an anode and a cathode. When the electron of exciton returns to a ground state, an energy difference between an excited state and the ground state is extracted as light. There are fluorescence that is emitted when the electron return from a singlet excited state to a ground state and phosphorescence that is emitted when the electron return from a triplet excited state to a ground state as light emission from the EL element.

The above EL layer has a laminated layer structure typified by "a hole transporting layer/a light-emitting layer/an electron transporting layer". An EL material that forms an EL layer is roughly divided into a low molecular weight based (monomer-based) material and a high molecular weight based (polymer-based) material. A low molecular weight based material is generally formed by using an evaporation apparatus.

In a conventional evaporation apparatus, a substrate is placed in a substrate holder and an evaporation container that is filled with an evaporation material having an EL layer, a shatter that prevents an evaporation material to be evaporated from ascending, and a heater that heats the EL materials in the chamber are included. In the above evaporation apparatus, the container is heated by heating the heater; therefore, heat is transmitted to the material. Then, the evaporation material that reached at an evaporation temperature is evaporated and formed over a rotating substrate. However, since the evaporated evaporation material has a width in proportion to a distance to the substrate, a distance between the substrate and the container in which the evaporation material is filled needs to be spaced for 1 m or more to carry out uniform deposition over a large-sized substrate.

In such conventional evaporation apparatus as mentioned above, the apparatus itself is enlarged and it takes longer time for evacuation of each film formation chamber of the evaporation apparatus as a size of a substrate area is bigger. Therefore, when a chamber is exposed to an atmosphere to exchange a material, a evaporation to form a film cannot be carried out for a long time and decreases a throughput, which are problems. Also, in carrying out deposition over a large-seized substrate, a film thickness is uneven at a central part and a periphery part, and further, it is necessary to rotate a substrate that is facing down. Therefore, there is a limitation to apply an evaporation apparatus to a large-sized substrate.

In addition, when an EL layer is formed by evaporation, most of the evaporated evaporation material is adhered to the inner wall of the film formation chamber, the shatter, or a contamination shield (a protective plate preventing a evaporation material from being adhered to the inner wall of the film formation chamber) of the evaporation apparatus. Therefore, during film formation of an EL layer, utilizing efficiency of the expensive evaporation material is quite low for about 1% or less and the manufacturing cost of the light-emitting device is extremely high.

As one means for solving such problems as mentioned above, the evaporation apparatus (Reference 1: Japanese Patent Laid-Open No. 2001-247959 and Reference 2: Japanese Patent Laid-Open No. 2002-60926) is proposed by this applicant. This evaporation apparatus is an apparatus in which deposition is carried out by fixing a substrate and by reciprocating an evaporation source, which is superior in film uniformity of a large-sized substrate compared to evaporation according to the conventional substrate rotating system. Furthermore, material efficiency gets well since a distance between the substrate and the evaporation source is close, and there is an advantage in reduction of the manufacturing cost.

Many evaporation materials are needed in a large-sized substrate, and a small evaporation container is soon emptied of the evaporation material. Therefore, the number of evaporation container is increased and they are exchanged frequently. However, deposition time per substrate gets longer for a large-sized substrate; therefore, there is high possibility that an evaporation material is run out during film formation. Furthermore, throughput is decreased due to surplus heating time. Thus, it is necessary to enlarge an evaporation container to be filled with a large amount of evaporation materials to evaporate for a long time.

As for a kind of an evaporation container, a boat type shown in FIG. 6A and a crucible type shown in FIG. 6B or 6C are general, and a crucible type that is capable of being filled with a large amount of evaporation materials is appropriate for using as a mass-production apparatus.

Although such evaporation containers can be filled with quite large amount of evaporation materials, the thermal capacitance of the evaporation container and the evaporation material are large; therefore, temperature of the entire evaporation container tends to be uneven. Compared to the bottom part of the evaporation container, temperature at the upper part thereof including an opening likely to be low since it is difficult to heat directly with a heater and a large amount of heat is escaped. Therefore, a particle evaporated from an evaporation material (hereinafter, referred to as an evaporation particle) is cooled at the opening, and then adhered to the opening. Then, once the evaporation particle is adhered, the particle continues to grow as a core, and lastly the opening of the evaporation container is clogged with the evaporation material and the evaporation material does not scatter; therefore, further film deposition is impossible, which is a problem.

On the other hand, in order to exchange the evaporation container set at an evaporation source, the upper part of the evaporation source needs to be opened since it is easy to be removed. In addition, a space for removing the evaporation container is necessary between the evaporation source and the evaporation container, and since a heat portion and the chamber do not contact with each other, a heating system with radiant heat is adopted as a heating method.

However, there is a problem that the radiant heat escapes easily and the upper part of the evaporation container is unlikely to be heated since the upper part of the evaporation source is opened. Therefore, there is a difference between temperature at the bottom part and the upper part of evaporation container, and the evaporated evaporation material is cooled at the upper part of the evaporation container, which generates a problem that the material clog at the opening. Specifically, an evaporation material with high evaporation temperature is likely to generate temperature difference and evaporation is difficult.

SUMMARY OF THE INVENTION

An object of the present invention is to provide a manufacturing apparatus superior in terms of throughput and that have an evaporation source that can continue scattering a material in a stable state for a long time in a manufacturing apparatus carrying out evaporation.

An embodiment of the invention disclosed in this specification is a deposition apparatus comprising a film formation chamber in which an evaporated material evaporated by heating an evaporation source is evaporated over a substrate, wherein the evaporation source includes a heat portion, a container with a cavity for being filled with a material, and a driving portion having a mechanism for moving the container up and down.

A specific composition of the invention is a deposition apparatus including a film formation chamber in which deposition is carried out over a substrate by evaporating an evaporation material from an evaporation source disposed opposed to the substrate, comprises an evaporation source having a hollow cylindrical heater that heats at a direction of an internal circumference, a container placed in the hollow cylindrical heater, and a support mounting the container, and a means for driving for moving the container up and down relatively to the heater.

In the above composition, the means for driving moves the container up and down integrally with the support being independent from the heater.

According to the invention, the evaporation container is moved down by the driving portion even when the opening of the evaporation container is clogged with an evaporation material; therefore, the evaporation container sealed in the heat portion and the adhered evaporation particle is evaporated so that blockage can be dissolved.

In addition, another embodiment of the invention is a manufacturing apparatus in which the heat portion has at least two independent heating mechanisms and the heating mechanisms can be controlled independently.

Specifically, the above composition is a deposition apparatus comprising a film formation chamber in which deposition is carried out over a substrate by evaporating an evaporation material from an evaporation source disposed opposed to the substrate, wherein the evaporation source comprises a hollow cylindrical first heater, a hollow cylindrical second heater, said first and second heaters heating in a direction of an internal circumference; and a container that moves up and down from the position of the first heater to the position of the second heater, wherein the container is moved to the position of the second heater to keep warm and cool a material placed in the container, and an opening at a top cover of the container is heated by the first heater.

According to the invention, when the evaporation container is placed in the heat portion, the heating mechanism is controlled independently at the upper part and the bottom part of the evaporation container, where blockage in the opening is dissolved due to the heating mechanism the upper part and the evaporation material can be heated up to such a temperature that the evaporation material does not evaporate due to the heating mechanism of the bottom part.

In addition, further another composition of the invention is a deposition apparatus comprising a film formation chamber in which deposition is carried out over a substrate by evaporating an evaporation material from an evaporation source disposed opposed to the substrate, wherein the evaporation source includes a hollow cylindrical first heater, a hollow cylindrical second heater, said first and second heaters heating in a direction of an internal circumference; and a container that moves up and down from the position of the first heater to the position of the second heater, wherein a material placed in the container is beforehand heated at the position of the second heater, and the evaporation material placed in the container is evaporated at the position of the first heater.

In the above composition, the heating temperature of the second heater is lower than the heating temperature of the first heater.

In addition, in the above composition, when the container is positioned at the first heater, the entire container is heated with the first heater. In addition, when the container is positioned at the second heater, the bottom part of the container is heated with the second heater and the upper portion of the container is heated with the first heater at the same time.

According to the invention, temperature of an evaporation material can be prevented from being lowered by the second heater; therefore, a crucible can be moved to a position of the upper first heater after dissolving the blockage; therefore, heating time can be shortened up to such a predetermined deposition rate.

In addition, in the above composition, the container includes an opening at a center of the top cover in which an evaporation material is placed therein.

In addition, in the above composition, the deposition apparatus has a means for moving the evaporation source in an X direction or a Y direction in a film formation chamber.

In addition, still further another composition of the invention is a manufacturing apparatus comprising a deposition apparatus evaporating an evaporation material by heating an evaporation source over a substrate and having an operation to exchange an evaporation container and cover the exchanged evaporation container with a hot plate.

Specifically, the above composition is a manufacturing device comprising a load chamber; a transfer chamber coupled with the load chamber; a film formation chamber coupled with the transfer chamber; and an installation chamber coupled with the film formation chamber, wherein the film formation chamber is coupled with a vacuum exhaust treatment chamber that vacuums the film formation chamber, and includes a means for moving an evaporation source and the evaporation source including a container in which an evaporation material is sealed and means for heating the container, and the installation chamber is coupled with a vacuum exhaust treatment chamber that vacuums the installation chamber and includes means for providing a container, a means for heating the upper part of the container (a hot plate or the like), and means for transferring the container to the evaporation source in the film formation chamber.

According to the invention, when an evaporation material is clogged at an opening of an evaporation container, the evaporation container in an evaporation source is exchanged and the exchanged evaporation container is covered with a hot plate thereover; therefore, blockage can be dissolved.

A manufacturing apparatus according to the invention can use a filled material completely without exposing to an atmosphere as well as can dissolve blockage of an evaporation material in a deposition step of carrying out evaporation; therefore, it is a manufacturing apparatus superior in throughput that can carry out stable evaporation for a long time.

BRIEF DESCRIPTION OF THE DRAWINGS

FIGS. 6A to 6C are views showing evaporation containers.

DETAILED DESCRIPTION OF THE PREFERRED EMBODIMENTS

Hereinafter, embodiments of the present invention is described.

Embodiment 1

Figure 1A:
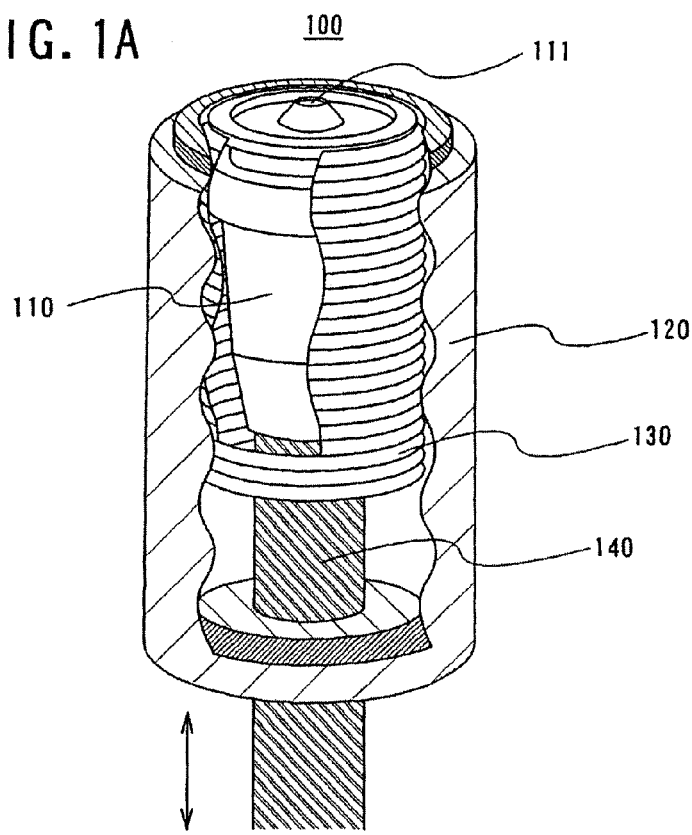
FIGS. 1A to 1C are views showing Embodiment 1.

A perspective view of an evaporation source concerning a manufacturing apparatus of the present invention is shown in FIG. 1A. An evaporation source 100 includes a crucible 110 filled with an evaporation material, a heat portion 120 having a mechanism for heating the crucible, a support (not shown) mounting the crucible, and a driving portion 140 that moves the crucible up and down. Opening 111 is provided at the upper part of the crucible and an evaporation material scatters from the opening 111 as the evaporation material is heated and reached at an evaporation temperature. Note that the opening 111 may be entirely opened or may be partly opened.

The heat portion 120 includes a heater 130 for heating the crucible 110 with a structure surrounding the crucible 110. The heater 130 may be spirally wound as shown in the figure or wound so as to fold longitudinally. The heater 130 and the crucible 110 may be in contact or in non-contact. In the case of non-contact, it is preferable to provide a mechanism to fix a container on the support. Note that the crucible 110 is heated by using radiant heat in the case of non-contact.

The material of the crucible 110 may be selected from metal such as tantalum, molybdenum, tungsten, or titanium or an arbitrary material from ceramic such as boron nitride or alumina. The thickness of the crucible 110 can be appropriately decided by considering content, shape of the evaporation material, or thermal conductivity of a cell material.

The driving portion 140 may be a driving by a hydraulic type or a stepping motor. The crucible 110 can be placed in the heat portion 120 by driving the driving portion 140 to move below thereof.

Figure 1B:
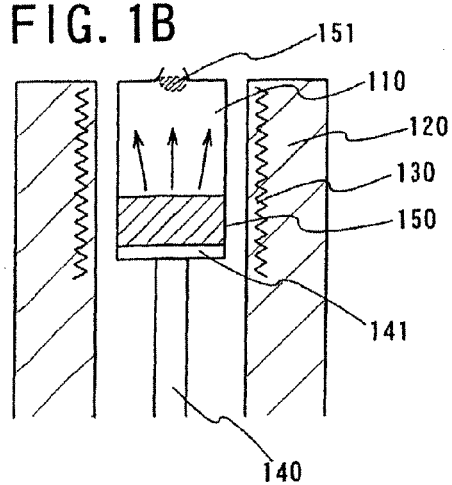

FIG. 1B shows a cross-sectional view of the evaporation source 100. An inner cover for preventing bumping may be provided inside the crucible, which is not shown. A support 141 that mounts the crucible and a driving portion 140 that moves the crucible up and down are provided below the crucible. In addition, the driving portion 140 and the support 141 may be integrated.

In addition, a thermocouple for monitoring temperature may be provided at a part where a crucible 110 is in contact with, that is, the support 141. A deposition rate is controlled and more stable evaporation can be carried out by carrying out current control to the heater while monitoring the temperature.

When an evaporation material 150 in the crucible is continued to be scattered and when temperature at the upper part of the crucible is low, an evaporation material 151 is accumulated at vicinity of the opening as shown in FIG. 1B. In such a condition, the deposition rate is lowered and lastly the opening is clogged; therefore, the evaporation material does not scatter.

Figure 1C:
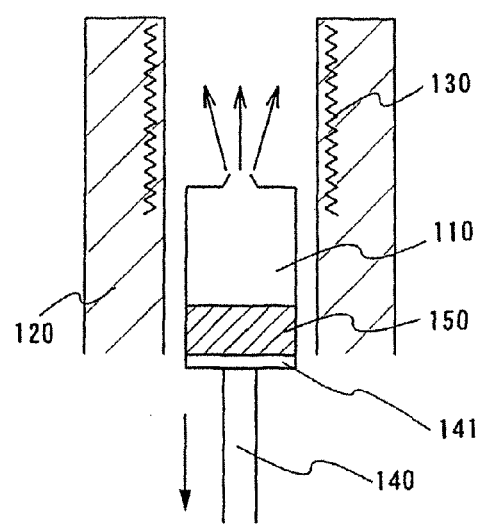

Thus, when the deposition rate begin to lower during film formation, as shown in FIG. 1C, a driving portion 140 is driven and a crucible 110 is moved down to draw into inside a heat portion. Since temperature at an opening of the crucible increases, the evaporation material 151 accumulated in the opening is evaporated again; therefore, blockage can be dissolved.

In manufacturing an organic EL element, copper phthalocyanine (CuPc), 4,4'-bis-[N-(naphthyl)-N-phenyl-amino]biphenyl (α-NPD), tris-8-quinolinonato aluminum complex ($Alq_3$), lithium fluoride (LiF), or the like is used for an evaporation material filled in a crucible; however, it is not limited thereto. In addition, the invention can be applied not only to an evaporation step in an organic EL element but also to an evaporation step concerning other devices.

Embodiment 2

Figure 2:
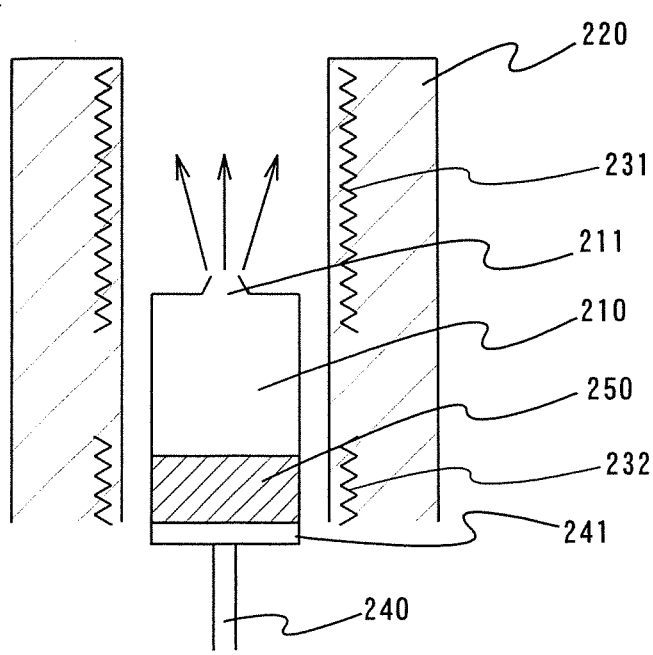
FIG. 2 is views showing Embodiment 2.

Another embodiment according to the present invention is shown in FIG. 2. An evaporation source 200 includes a crucible 210, a heat portion 220, a support 241, and a driving portion 240, and the heat portion 220 includes a first heater 231 and a second heater 232. It is preferable that the first heater 231 and the second heater 232 have control to be able to be heated independently, and the first heater 231 is used to be heated in the case of evaporation.

Evaporation is carried out by heating the crucible 210 with the first heater 231. When the deposition rate begin to lower, the crucible 210 is drawn into inside the heat portion and a material accumulated in an opening 211 is scattered by heating the first heater 231; therefore, blockage is dissolved. Simultaneously, it is possible to heat the crucible 210 with the second heater 232 up to such a preliminary heating temperature that the evaporation material does not scatter. Therefore, the temperature of the evaporation material can be prevented from being lowered so that the crucible is moved above after blockage is dissolved and heating time can be shortened up to such a predetermined deposition rate. Furthermore, when the second heater 232 is heated, the crucible 210 can be prevented from being rapidly cooled by moving the crucible 210 below and being in contact with the sidewall of the heat portion 220.

Embodiment 3

Figure 3A:
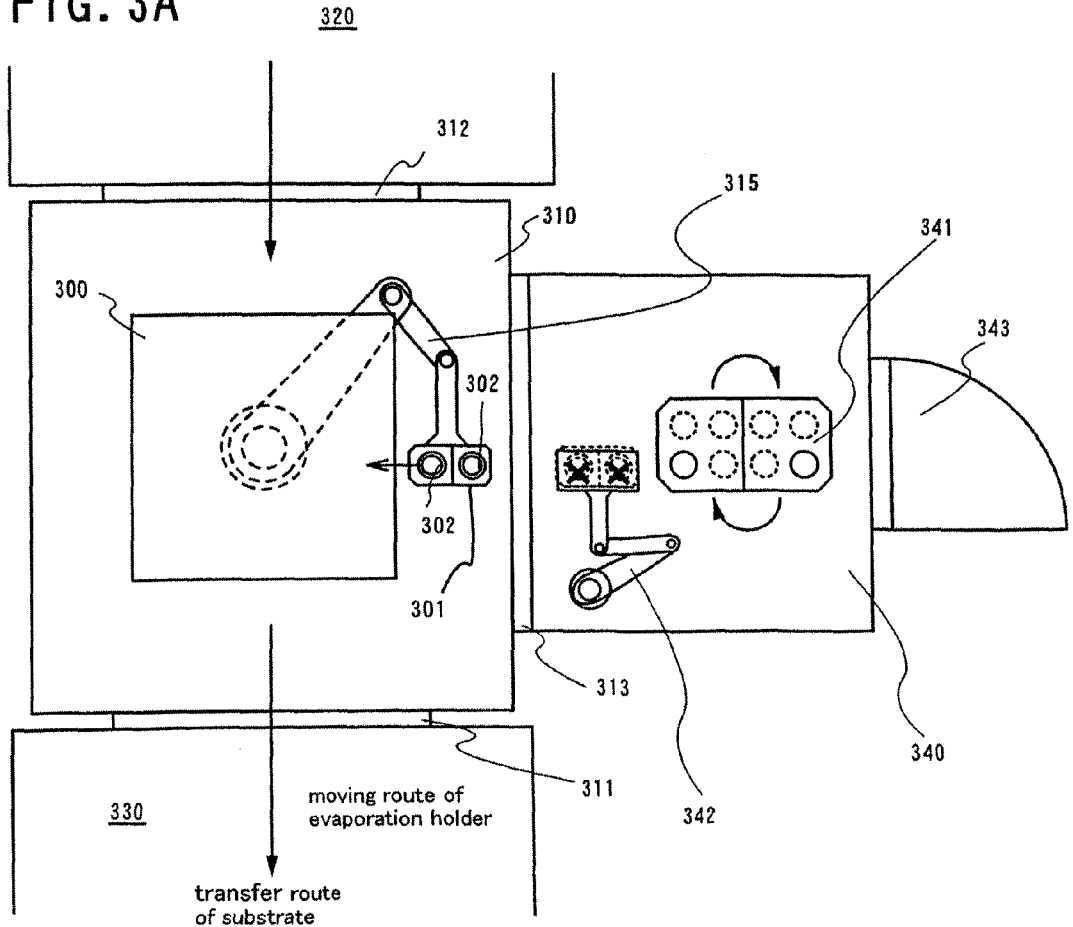
FIGS. 3A and 3B are views showing Embodiment 3.

FIG. 3A is a top view of a manufacturing apparatus using the present invention. In FIG. 3A, reference numeral 300 denotes a substrate; 310, a film formation chamber; 320 and 330, transfer chambers; 340, a crucible installation chamber; 315, an evaporation source driving robot; 342, a crucible transfer robot; 341, a crucible installation rotary table; 311, 312, and 313, shutters that partition each chamber; and 343, a door.

The substrate 300 is transferred from the transfer chamber 320 to the film formation chamber 310. In evaporating selectively, evaporation is carried out after carrying out alignment between an evaporation mask and the substrate.

Two crucibles 302 filled with an evaporation material are set at an evaporation source 301. A sliding type shutter is provided at upper part of each crucible, which is not shown. The evaporation source equipped with the two crucibles is shown in FIG. 3A; however, three crucibles or more may be equipped and the invention is not limited to the structure of FIG. 3A. The two crucibles may be filled with the same evaporation material or may be filled with a different evaporation material such as a host material and a dopant material.

The crucible 302 set at the evaporation source 301 is heated and an evaporation particle is scattered from an opening of the upper part of the crucible when the crucible 302 is heated to deposition temperature or higher. Here, after remaining a predetermined deposition rate and stabilizing, a substrate shatter (not shown) is opened and the evaporation source driving robot 315 that moves the evaporation source 301 is driven to carry out evaporation over the substrate. A uniform film is formed over the substrate by repeatedly reciprocating the evaporation source 301. After the deposition, the substrate shutter is closed and the substrate 300 is transferred to the transfer chamber 330. Through the repetition of such evaporation, an evaporation material can be formed over large amount of substrates.

In addition, a mechanism for changing the crucible 302 set at the evaporation source 301 is provided for the manufacturing apparatus of FIG. 3A. Hereinafter, the procedure is described.

The crucible installation chamber 340 is vented and is in an atmospheric pressure. At this time, the film formation chamber 310 is held at vacuum degree since there is the shatter 313. After the door 343 is opened and the crucible filled with an EL material is set at the crucible installation rotary table 341, the door is closed and the atmosphere in the crucible installation chamber is evacuated to be the same vacuum degree as that of the film formation chamber or less. The crucible installation chamber 340 is smaller than the film formation chamber 310; therefore, it is possible to reach predetermined voltage with a short time. As reaching to the predetermined vacuum degree, the shutter 313 is opened, the crucible transfer robot 342 is driven, and a first crucible set at the evaporation source 301 is taken out to set at the crucible installation rotary table 341. A second crucible filled with the material is taken out by rotating the crucible installation rotary table and set at the evaporation source 301.

Figure 3B:
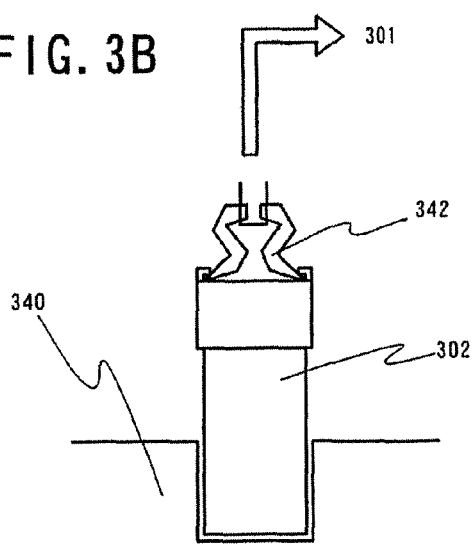

Note that the transfer mechanism in the invention is not limited to a structure in which, as shown in FIG. 3B, the pick-up portion of the crucible transfer robot 342 is hooked inside the crucible from the upper part the crucible 302 to be transferred, and a structure transferring by holding the side of the crucible may be applied.

Figure 4:
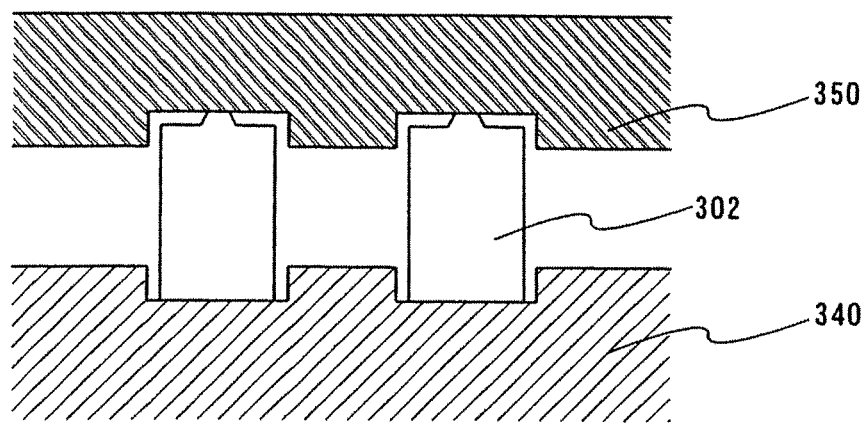
FIG. 4 is a view showing Embodiment 3.

Such a crucible exchange mechanism can be used for exchanging the crucible which is emptied of the evaporation material; however, it is also effective when blockage in the crucible is caused. The crucible blocked with the evaporation material is set at the crucible installation chamber 340 by driving the crucible transfer robot 342. Thereafter, as shown in FIG. 4, an upper part of the crucible 302 is heated with a hot plate 350. The evaporation material clogging at the opening is evaporated again and the blockage of the evaporation material can be dissolved. The crucible dissolved with the blockage can be set at the evaporation source 301 again, which makes high material efficiency and a device superior in throughput.

In the crucible set at the crucible installation rotary table 341, the crucible may be heated up to such a temperature that the material does not scatter with a built-in heater during vacuum evacuation, which enables to shorten heating time after exchanging and is an apparatus with higher throughput.

The inventions composed of the above composition is described further in detail in examples shown hereinafter; however, the invention is not limited to the following examples.

EXAMPLE

Figure 5:
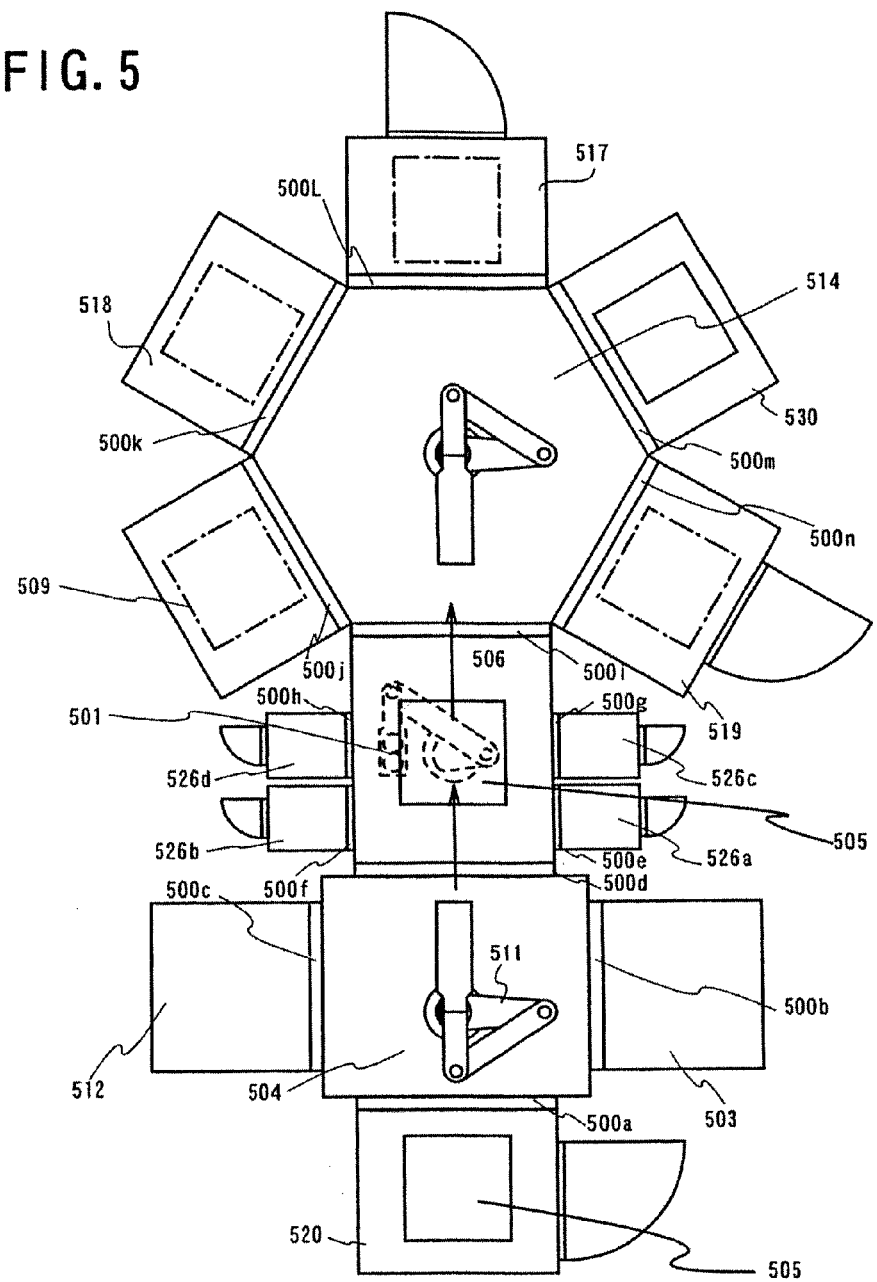
FIG. 5 is a view showing Example.

A top view of a multi-chamber manufacturing apparatus is shown in FIG. 5. The manufacturing apparatus shown in FIG. 5 includes shutters 500a to 500n, a substrate loading chamber 520, a sealing and unloading chamber 519, transfer chambers 504 and 514, film formation chambers 506, 509, and 512, crucible installation chambers 526a to 526d, a pretreatment chamber 503, a sealing substrate loading chamber 517, and a sealing chamber 518. Note that the film formation chamber 506 may compose a plurality of chambers, which enables to separately use the chambers by a layer of an organic EL element in this case.

Hereinafter, a process for manufacturing an organic El element is described. A substrate is set at the substrate loading chamber 520. As a kind of a substrate, glass, plastic, or the like is used, of which size is 320 min×400 mm, 370 mm×470 mm, 550 mm×650 mm, 600 mm×720 mm, 680 mm×880 mm, 1000 mm×1200 mm, 1100 mm×1250 mm, and a further large-sized substrate sized 1150 mm×1300 mm can be accepted. In addition, in the above substrate, an anode (a first electrode) and an insulator (a wall) covering the edge of the anode are provided previously. Note that In manufacturing an active matrix type light-emitting device, a plurality of thin film transistors connected to the anode (current control TFT) and other thin film transistors (such as switching TFT) is previously provided over a substrate and there is a structure having a driver circuit composed of a thin film transistor. In addition, it is also possible to manufacture with the manufacturing apparatus shown in FIG. 5 in manufacturing a passive matrix type light-emitting device.

It is preferable that a substrate has been washed. An organic El element is sensitive to unevenness the surface. The remaining slight dust results in a defect such as a dark spot or a point defect and induces decrease in reliability. As a method for washing a substrate, it is preferable to wash with a porous sponge (typically, made of PVA (polyvinyl alcohol) or nylon) containing a surfactant on the surface of the first electrode (anode) to remove the dust on the surface. As a washing mechanism, a washing apparatus having a roll brush (made of PVA) in contact with the surface of the substrate by rotating around an axis parallel to the surface of the substrate may be used. Alternatively, a washing apparatus having a disk brush (made of PVA) in contact with the surface of the substrate while rotating around an axis perpendicular to the surface of the substrate may be used.

Next, the substrate set at the substrate loading chamber 520 is transferred to the transfer chamber 504. In the transfer chamber 504, a transfer mechanism 511 (such as a transfer robot) for transferring or reversing the substrate and a vacuum evacuation means are provided, and a transfer mechanism and a vacuum evacuation means are respectively provided also for the another transfer chamber 514 as well. The robot provided for the transfer chamber 504 can reverse the substrate and the substrate can be transferred to the film formation chamber 506 by being reversed. In addition, the transfer chamber 504 can be held in, atmospheric pressure or in vacuum. The transfer chamber 504 is coupled with a vacuum exhaust treatment chamber, which enables to evacuate and to hold in atmospheric pressure by introducing an inert gas after the vacuum evacuation.

The above a vacuum exhaust treatment chamber is equipped with a magnetic levitation type turbo-molecular pump, a cryo pump, or a dry pump. Accordingly, it is possible to set a reached vacuum degree of the transfer chamber coupled with each chamber at from $10^{-5}$ to $10^{-6}$ Pa and further it is possible to control reverse diffusion of an impurity from the side of the pump and an evacuation system. In order to prevent an impurity from being introduced into the apparatus, an inert gas such as a rare gas or nitrogen is used for a gas to be introduced. A gas highly purified by a gas purifier before the introduction into the apparatus is used for such a gas introduced into the apparatus. Therefore, it is necessary to prepare a gas purifier to introduce to the evaporation apparatus after the gas is highly purified. Accordingly, oxygen, water, or other impurities contained in the gas can be previously removed; therefore, the impurities can be prevented from being introduced into the apparatus.

Next, the substrate is transferred from the transfer chamber 504 to the pretreatment chamber 503 in which vacuum heating is possible, and vacuum heating is carried out just before the evaporation. Moisture and gas mostly remain over the substrate, of which component sometimes gives an adverse effect to an evaporated film in a step before the evaporation. Therefore, it is necessary to prevent penetration of the remained component from the deposition surface of the substrate. In order to remove moisture or other gases contained on the above substrate completely, annealing for deaeration is carried out in vacuum (1 Pa or less, preferably from $10^{-4}$ to $10^{-6}$ Pa). Specifically, when an organic resin film is used as a material of an interlayer insulating film or a bank, some organic resin materials easily adsorb moisture and further there is a risk of generation of deaeration. Therefore, heating is carried out at from 100° C. to 250° C., preferably from 150° C. to 200° C. for, for example, 30 minutes before forming a layer containing an organic compound, and then natural cooling is carried out for 30 minutes.

In addition, if necessary, a hole injection layer made of a high molecular weight material may be formed under atmospheric pressure or reduced pressure with an ink jet method, spin coating, a spray method, or the like in the film formation chamber 512. In addition, after applying with an ink-jet method or a spray method, uniformity of a film thickness may be made with a spin coater. Furthermore, deposition may be carried out with an ink-jet method in vacuum with the substrate placed longitudinally.

For example, in the film formation chamber 512, poly (ethylene dioxythiophene)/poly (styrene sulfonic acid) solution (PEDOT/PSS), polyaniline/camphorsulfonic acid solution (PANI/CSA), PTPDES, Et-PTPDEK, PPBA, or the like that operates as a hole injection layer (an anode buffer layer) may be entirely applied over the first electrode (anode) and be baked. It is preferable that the bake is carried out in the pretreatment chamber 503.

When a hole injection layer made of a high molecular weight material is formed by an application method by using a spin coater or the like, planarity is improved, which can improve coverage and uniformity of a film thickness of a film formed thereover. Uniform light emitting can be obtained since a film thickness of the light-emitting layer is especially uniform. In this case, it is preferable to carry out vacuum heating (from 100 to 200° C.) just before deposition by an evaporation method after forming the hole injection layer by an application method.

For example, after washing the surface of the first electrode (anode) with a sponge, the substrate is carried into the substrate loading chamber 520 and is transferred to the film formation chamber 512, and poly (ethylene dioxythiophene)/ poly (styrene sulfonic acid) solution (PEDOT/PSS) is entirely applied to have a film thickness of 60 nm with spin coating. Thereafter, the substrate is transferred to the pretreatment chamber 503, pre-baked at 80° C. for 10 minutes, and baked at 200° C. for an hour, and further vacuum heating is carried out (170° C., heating for 30 minutes, and cooling for 30 minutes) just before the evaporation. Thereafter, the substrate is transferred to the film formation chamber 506 and a light-emitting layer may be formed by an evaporation method without being exposed to an atmosphere. Specifically, when an ITO film is used as an anode material and there is an unevenness or a minor particle, it is possible to relieve the effect of such unevenness by forming the PEDOT/PSS in a film thickness of 30 nm or more.

In addition, when the PEDOT/PSS is formed by spin coating, it is formed over the entire surface. Therefore, it is preferable that the film of PEDOT/PSS at the edge or periphery portion of the substrate, a terminal portion, a connection region between a cathode and a lower wiring, or the like is preferable to be selectively removed and it is preferable to be removed with $O_2$ ashing or the like by using a mask in the pretreatment chamber 503. The pretreatment chamber 503 has a plasma generating means and plasma is generated by exciting one or more kinds of gas of Ar, H, F, and O, thereby carrying out dry etching. Furthermore, it is also possible to etch selectively only an unnecessary part by using the mask. In addition, an UV irradiation mechanism may be provided for the pretreatment chamber 503 so that an ultraviolet ray irradiation is carried out as anode surface treatment.

Next, the substrate is transferred to the film formation chamber 506 coupled with the transfer chamber 504 by the transfer mechanism 511, and an organic compound layer made of the low weight molecule is appropriately formed, which serves as a hole injection layer, a hole transport layer, a light-emitting layer, an electron transport layer, or an electron injecting layer. By appropriately selecting an EL material, a light-emitting element that shows a monochrome light emitting (specifically, white, red, green, or, blue) as a whole can be formed.

Deposition is carried out by moving the robot equipped with an evaporation source 501 and a crucible filled with the evaporation material can be set at the evaporation source. A material of the crucible is composed of titanium; however, it is not limited thereto. An opening for evaporation is provided at the upper part of the crucible and an evaporation particle scatters from the opening by heating the material. When the appropriate deposition rate is stably reached, the robot makes a reciprocative movement to carry out deposition. A mechanism for moving the crucible up and down is provided at the bottom part of the crucible and when the deposition rate begins to lower, blockage in the opening is dissolved by moving the crucible below and heating. As the deposition rate rises, the crucible is moved above and film deposition is carried out again.

In addition, the crucible installation chambers from 526a to 526d are provided for the film formation chamber 506 and equipped with the plurality of crucibles filled with the evaporation material. The crucible filled with the necessary evaporation material is transferred to the film formation chamber and evaporation is sequentially carried out. Alignment of an evaporation mask and a substrate is preferably carried out by image recognition with CCD camera or the like. As the evaporation is finished, the substrate is transferred to the next transfer chamber side.

Next, the substrate is taken out from the film formation chamber 506 with the transfer mechanism provided in the transfer chamber 514 and a cathode (or a protective film) is formed by transferring to the film formation chamber 509 without exposing to atmosphere. The cathode is an inorganic film formed by an evaporation method using resistance heating (alloy of MgAg, MgIn, $CaF_2$, LiF, CaN, or the like or a film formed of an element belonging to Group 1 or 2 of the periodic table and aluminum by a co-evaporation method, or a laminated film thereof). In addition, the cathode may be formed by sputtering.

In addition, in case of manufacturing a top emission type or dual emission type light-emitting device, a cathode is preferable to be transparent or translucent. It is preferable that the thin film of the above metal thin film (from 1 nm to 10 nm) or a laminate of the thin film of the above metal thin film (from 1 nm to 10 nm) and a transparent conductive film serves as a cathode. In this case, a film formed of indium tin oxide (ITO) that is a transparent conductive film, indium zinc oxide (IZO), zinc oxide (ZnO), or the like that is a transparent conductive film may be formed in the film formation chamber 509 by sputtering.

An organic EL element having a laminated structure is formed through the above steps.

In addition, a protective film made of a silicon nitride film or a silicon nitride oxide film may be formed to seal in the film formation chamber 509 coupled with the transfer chamber 514. In this case, a target made of silicon, a target made of silicon oxide, or a target made of silicon nitride is equipped with in the film formation chamber 509. In addition, a protective film may be formed by moving a stick target to the fixed substrate. Furthermore, the protective film may be formed by moving a substrate to the fixed stick target.

For example, a silicon nitride film can be formed over a cathode by using a disc shaped target made of silicon and by making atmosphere in the film formation chamber nitrogen atmosphere or atmosphere containing nitrogen and argon. In addition, a thin film mainly containing carbon (a DLC film, a CN film, or an amorphous carbon film) may be formed as a protective film and separately a film formation chamber using CVD may be provided. A diamond-like carbon film (also referred to as a DLC film) can be formed by plasma CVD (typically, RF plasma CVD, microwave CVD, electron cyclotron resonance (ECR) CVD, hot-filament CVD, or the like), a combustion flame method, sputtering, ion beam evaporation, laser evaporation, or the like. A hydrogen gas and a hydrocarbon system gas (for example, $CH_4$, $C_2H_2$, $C_6H_6$, or the like) are used as a reactive gas used for deposition and ionized by glow discharge, and film formation is carried out by accelerating and colliding ion at a cathode discharged with a negative self bias. In addition, a CN film may be formed by using a $C_2H_4$ gas and a $N_2$ gas as a reactive gas. Note that a DLC film and a CN film are an insulating film that is transparent or translucent to visible light. Transparency to visible light refers to that the transmittance of visible light is from 80 to 100% and translucency to visible light refers to that the transmittance of visible light is from 50 to 80%.

Next, a substrate over which an organic EL element is formed is transferred to the sealing and unloading chamber 519 from the transfer chamber 514.

A sealing substrate is set at the sealing substrate loading chamber 517 from the outside. It is preferable that vacuum annealing is previously carried out to remove an impurity such as moisture. Then, when a sealant for attaching a substrate provided with a light-emitting element is provided for the sealing substrate, the sealant is formed in the sealing chamber 518 and the sealing substrate over which the sealant is formed is transferred to a sealing substrate stocking chamber 530. Note that a drying agent may be provided for the sealing substrate in the sealing chamber 518. In addition, an evaporation mask used at evaporation may be stocked in the sealing substrate stocking chamber 530. Here, an example in which the sealant is formed for the sealing substrate is shown; however, the invention is not specifically limited and a sealant may be formed for a substrate over which an organic EL element is formed.

Next, the substrate and the sealing substrate are attached to each other in the sealing and unloading chamber 519 and the pair of the attached substrates is irradiated with UV light by an ultraviolet ray irradiation mechanism provided for the sealing and unloading chamber 519 to cure the sealant. Here, an ultraviolet curable resin is used as a sealant; however, the sealant is not limited as long as it is an adhesive material.

Next, the pair of the attached substrates is taken out from the sealing and unloading chamber 519.

As mentioned above, an organic El element can avoid being exposed to atmosphere by using the manufacturing apparatus shown in FIG. 5 until the organic EL element is sealed completely in an enclosed space; therefore, it is possible to manufacture a light-emitting device using an organic El element with high reliability. In addition, evaporation is finished by moving the evaporation source 501 and by moving the substrate in the film formation chamber 506, so that evaporation is completed in a short time and the light-emitting device can be manufactured with high throughput.

Note that a controller for controlling an operation at each treatment chamber, a controller for transferring among each treatment chamber, a controller that realizes automation by controlling a route for moving the substrate to each treatment chamber, or the like is provided, which is not shown here.

In addition, in the manufacturing apparatus shown in FIG. 5, a substrate provided with a transparent conductive film (or a metal film (TiN)) as an anode is carried and a layer containing an organic compound is formed. Thereafter, a transparent or translucent cathode (for example, a laminate layer of a thin metal film (Al or Ag) and a transparent conductive film) is formed. Accordingly, it is possible to form a top emission type (or dual emission) organic EL element. Note that the top emission type organic EL element refers to an element in which light emission generated in an organic compound layer is extracted by transmitting a cathode.

In addition, in the manufacturing apparatus shown in FIG. 5, a substrate provided with a transparent conductive film as an anode is carried and a layer containing an organic compound is formed, and then a cathode made of a metal film (Al or Ag) is formed. Accordingly, it is also possible to form a bottom emission type organic El element. Note that the bottom emission type light-emitting element refers to an element in which light emission generated in an organic compound layer is extracted from an anode that is a transparent electrode to a TFT and further passes through the substrate.

As mentioned above, the manufacturing apparatus in this example can be applied to manufacturing of various organic EL elements and further it is possible to stably carry out evaporation for a long stretch of time; therefore, productivity can be largely improved.

This application is based on Japanese Patent Application serial no. 2003-293837 filed in Japanese Patent Office on Aug. 15 in 2003, the contents of which are hereby incorporated by reference.

Although the present invention has been fully described by way of example with reference to the accompanying drawings, it is to be understood that various changes and modifications depart from the scope of the present invention hereinafter defined, they should be construed as being included therein.

What is claimed is:

1. A method for manufacturing a layer comprising:
forming a layer over a surface by evaporating a material at a first position,
during the formation of the layer, moving a container that comprises the material to a second position so that an opening of the container is heated at a second temperature higher than a first temperature, wherein the first temperature is a temperature of the opening at the first position,
wherein the second position is under the first position.

2. The method for manufacturing a layer according to claim 1, wherein a rate of evaporating the material is controlled in accordance with a monitored temperature.

3. The method for manufacturing a layer according to claim 1, wherein the material is heated by a hollow cylindrical heater.

4. A method for manufacturing a device, comprising the method for manufacturing a layer according to claim 1.

5. A method for manufacturing a layer comprising:
forming a layer over a surface by evaporating a material at a first position at a first deposition rate,
during the formation of the layer, when the first deposition rate is changed into a second deposition rate smaller than the first deposition rate, moving a container that comprises the material to a second position so that an opening of the container is heated at a second temperature higher than a first temperature, wherein the first temperature is a temperature of the opening at the first position,
wherein the second position is under the first position.

6. The method for manufacturing a layer according to claim 5, wherein a rate of evaporating the material is controlled in accordance with a monitored temperature.

7. The method for manufacturing a layer according to claim 5, wherein the material is heated by a hollow cylindrical heater.

8. A method for manufacturing a device, comprising the method for manufacturing a layer according to claim 5.

9. A method for an evaporation comprising:
evaporating a material at a first position,
moving a container that comprises the material to a second position, so that an opening of the container is heated at a second temperature higher than a first temperature, wherein the first temperature is a temperature of the opening at the first position,
wherein the second position is under the first position.

10. The method for an evaporation according to claim 9, wherein a rate of evaporating the material is controlled in accordance with a monitored temperature.

11. The method for an evaporation according to claim 9, wherein the material is heated by a hollow cylindrical heater.

12. A method for manufacturing a layer comprising:
forming a layer over a surface by evaporating a material at a first position,
during the formation of the layer, moving a container that comprises the material to a second position so that an opening of the container is heated at a second temperature higher than a first temperature, wherein the first temperature is a temperature of the opening at the first position,
wherein, at the second position, the material in the container is heated at a third temperature that the material does not evaporate.

13. The method for manufacturing a layer according to claim 12, wherein the second position is under the first position.

14. The method for manufacturing a layer according to claim 12, wherein a rate of evaporating the material is controlled in accordance with a monitored temperature.

15. The method for manufacturing a layer according to claim 12, wherein the material is heated by a hollow cylindrical heater.

16. The method for manufacturing a layer according to claim 12, wherein the second temperature and the third temperature are independently controlled.

17. A method for manufacturing a device, comprising the method for manufacturing a layer according to claim 12.

18. A method for manufacturing a layer comprising:
forming a layer over a surface by evaporating a material at a first position at a first deposition rate,
during the formation of the layer, when the first deposition rate is changed into a second deposition rate smaller than the first deposition rate, moving a container that comprises the material to a second position so that an opening of the container is heated at a second temperature higher than a first temperature, wherein the first temperature is a temperature of the opening at the first position,
wherein, at the second position, the material in the container is heated at a third temperature that the material does not evaporate.

19. The method for manufacturing a layer according to claim 18, wherein the second position is under the first position.

20. The method for manufacturing a layer according to claim 18, wherein a rate of evaporating the material is controlled in accordance with a monitored temperature.

21. The method for manufacturing a layer according to claim 18, wherein the material is heated by a hollow cylindrical heater.

22. The method for manufacturing a layer according to claim 18, wherein the second temperature and the third temperature are independently controlled.

23. A method for manufacturing a device, comprising the method for manufacturing a layer according to claim 18.

24. A method for an evaporation comprising:
evaporating a material at a first position,
moving a container that comprises the material to a second position, so that an opening of the container is heated at a second temperature higher than a first temperature, wherein the first temperature is a temperature of the opening at the first position,
wherein, at the second position, the material in the container is heated at a third temperature that the material does not evaporate.

25. The method for an evaporation according to claim 24, wherein the second position is under the first position.

26. The method for an evaporation according to claim 24, wherein a rate of evaporating the material is controlled in accordance with a monitored temperature.

27. The method for an evaporation according to claim 24, wherein the material is heated by a hollow cylindrical heater.

28. The method for an evaporation according to claim 24, wherein the second temperature and the third temperature are independently controlled.

* * * * *